(12) United States Patent
Xu et al.

(10) Patent No.: US 12,143,111 B2
(45) Date of Patent: Nov. 12, 2024

(54) FAST SIGNAL RESPONSE CIRCUIT WITH HYSTERESIS CONTROL

(71) Applicant: Global Technology Inc., Ningbo (CN)

(72) Inventors: Yangfeng Xu, Ningbo (CN); Xiaoyi Zheng, Ningbo (CN); Tongbo Hu, Ningbo (CN); Zuoyou Wang, Ningbo (CN)

(73) Assignee: Global Technology Inc., Ningbo (CN)

( * ) Notice: Subject to any disclaimer, the term of this patent is extended or adjusted under 35 U.S.C. 154(b) by 31 days.

(21) Appl. No.: 18/152,523

(22) Filed: Jan. 10, 2023

(65) Prior Publication Data

US 2023/0412156 A1    Dec. 21, 2023

(30) Foreign Application Priority Data

Jun. 21, 2022  (CN) .......................... 202210702209.7

(51) Int. Cl.
*H03K 3/037* (2006.01)
*H03K 19/20* (2006.01)
*H04Q 11/00* (2006.01)

(52) U.S. Cl.
CPC .......... *H03K 3/0377* (2013.01); *H03K 19/20* (2013.01); *H04Q 11/0067* (2013.01)

(58) Field of Classification Search
CPC .. H03K 3/0377; H03K 19/20; H03K 3/02337; H03K 3/13; H03K 3/2893; H03K 3/3565; H04Q 11/0067
See application file for complete search history.

(56) References Cited

U.S. PATENT DOCUMENTS

| | | | | |
|---|---|---|---|---|
| 6,957,278 B1 * | 10/2005 | Gallagher | .............. | H03K 5/084 327/66 |
| 2008/0290250 A1 * | 11/2008 | Schulz | .................. | H05B 45/22 250/201.1 |

* cited by examiner

*Primary Examiner* — Jung Kim
(74) *Attorney, Agent, or Firm* — Grossman Tucker Perreault & Pfleger, PLLC

(57) ABSTRACT

A fast signal response circuit with hysteresis control includes a switch element and a comparator. The switch element includes a first and a second input terminals and a control terminal, the first terminal is configured to receive a first reference signal, the second terminal is configured to receive a second reference signal, the control terminal is configured to receive a control signal, and the switch element is configured to output the first or the second reference signal through a first output terminal according to the control signal. The comparator includes a third input terminal, a fourth input terminal and a second output terminal, the third input terminal is connected to the first output terminal, the fourth input terminal is configured to receive a sensing signal corresponding to a light input, and the second output terminal is connected to the controller and is configured to output the comparison result.

15 Claims, 4 Drawing Sheets

FAST SIGNAL RESPONSE CIRCUIT WITH HYSTERESIS CONTROL

CROSS-REFERENCE TO RELATED APPLICATIONS

This non-provisional application claims priority under 35 U.S.C. § 119(a) on Patent Application No(s). 202210702209.7 filed in China on 2022 Jun. 21, the entire contents of which are hereby incorporated by reference.

BACKGROUND

1. Technical Field

This disclosure relates to a signal response circuit, especially to a fast signal response circuit with hysteresis control.

2. Related Art

Along with the fast development of the technology, the needs of internet band width gradually increases. Several operators started big scale projects such as "band width speed raising" or "fiber optical in, copper out" to provide better service. The projects above use passive optical networks (PON) as basis and expands around it. The optical line terminal apparatus (OLT) corresponding to PON uses burst receive mode. Along with the increase of Internet speed, the increase of data transmission speed, the receiving speed of the PON light module needs to increase too, but in the case of high speed burst receive mode and no clock data recovery (CRD), for the control circuit to achieve fast signal response remains quite a challenge.

SUMMARY

According to above, the disclosure provides a fast signal response circuit with hysteresis control to solve the problem in connection with responding at fast signal reception.

A fast signal response circuit with hysteresis control according to an embodiment of the disclosure is disclosed. The disclosed circuit includes a switch element and a comparator. The switch element includes a first input terminal, a second input terminal, a first output terminal and a control terminal, the first terminal is configured to receive a first reference signal, the second input terminal is configured to receive a second reference signal, the control terminal is configured to receive a control signal, and the switch element is configured to output the first reference signal or the second reference signal through the first output signal according to the control signal. The comparator includes a third input terminal, a fourth input terminal and a second output terminal, the third input terminal is connected the first output terminal, the fourth input terminal is configured to receive a sensing signal corresponding to a light input, and the second output terminal is connected to the control terminal and is configured to output a comparison result.

According to above, the disclosed circuit may not be effected by Internet speed and CDR, and has fast and accurate response to the light input sensing signal, and may be applied to various types of optical line terminal apparatus of the passive optical network, various type of passive optical network light module of optical line terminal apparatus, such as gigabit passive optical networks (GPON) light modules, 10 gigabit passive optical networks (XGPON), Ethernet passive optical network (EPON) light modules among others. And instead of determining the intensity of the light input signal simply through a microcontroller the disclosed circuit might be achieving the goal of higher response speeds. Also, the disclosed circuit is also equipped with hysteresis control functionality, with details illustrated below.

DETAILED DESCRIPTION

Figure 1:
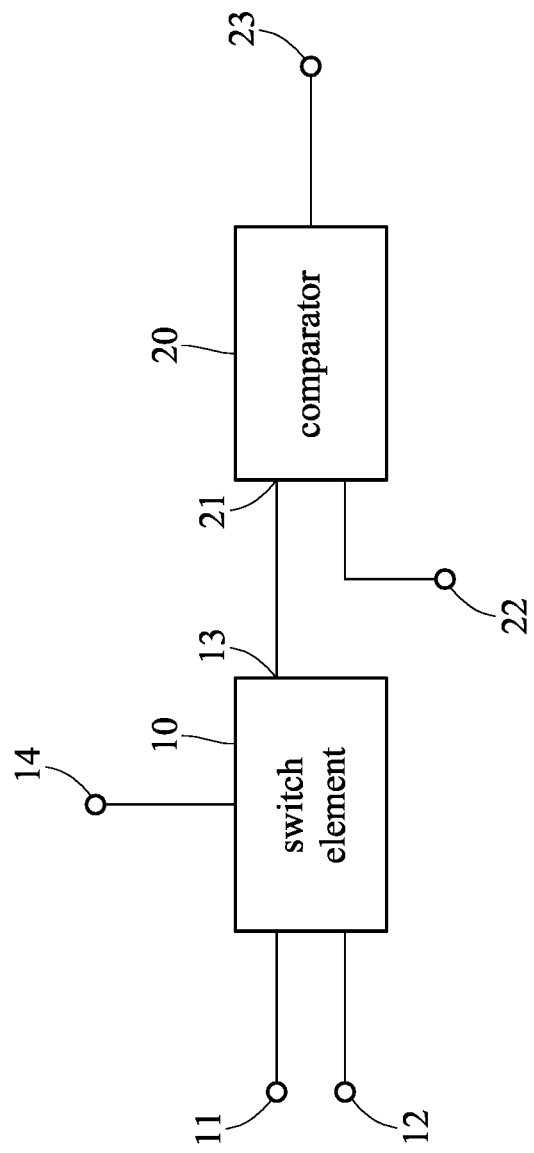
FIG. 1 shows a fast signal response circuit with hysteresis control configuration diagram according to an embodiment of the disclosure.

Please refer to FIG. 1, which shows a configuration diagram of a fast signal response circuit with hysteresis control according to an embodiment of the disclosure. As shown in FIG. 1, a fast signal response circuit 1 with hysteresis control includes a switch element 10 and comparator 20. The switch element 10 includes a first input terminal 11, a second input terminal 12, a first output terminal 13 and a control terminal 14. The first input terminal 11 is configured to receive a first reference signal, the second input terminal 12 is configured to receive a second reference terminal, the control terminal 14 is used to receive a control signal, and the switch element 10 is configured to output the first reference signal or the second reference signal through the first output terminal 13 according to the control signal. The comparator 20 includes a third input terminal 21, a fourth input terminal 22 and a second output terminal 23. The third input terminal 21 is electrically connected to the first output terminal 13, the fourth output terminal 22 is configured to receive a sensing signal corresponding to a light input, and the second output terminal 23 is electrically connected to the control terminal 14 and is configured to output comparison result. The comparison result of comparator 20 is associated with the control signal received by the control terminal 14.

In one implementation, a nanosecond (ns) high speed analog switch can be chosen as the switch element 10 with its response time about 50 ns, while a nanosecond (ns) high speed comparator can be chosen as the comparator 20 with its response time about 6 ns.

In this embodiment, the comparison result of comparator 20 may be the control signal of the control terminal 14. In particular, the comparison result actually is indicative of the signal level of the sensing signal, which could be greater or smaller than the signal level of the first and/or the second reference signals. With the control terminal 14 receiving the comparison result, the switch element 10 outputs either the first reference signal or the second reference signal based on the comparison result. In other words, the switch element 10 can selectivity output the first reference signal or the second reference signal according to the signal level of the control signal. More specifically, when the control signal is at its low potential, the switch element 10 outputs the first reference signal. On the other hand, when the control signal is at its high potential, the switch element 10 outputs the second reference signal. Meanwhile, that the control signal is at its high potential indicates a warning state, meaning there may be no or not enough light input. That the control signal is at its low potential indicates a normal state, meaning the light input is enough.

Further, initial state of the control signal is at its high potential. In other words, the initial state of the fast signal response circuit 1 might be by design set as the warning state, allowing for the switch element 10 to output the second reference signal to the comparator 20 through the first output terminal 13. Since the comparator 20 receives the sensing signal corresponding to the light input from the fourth input terminal 22, when the signal level of the sensing signal is smaller than the signal level of the second reference signal, the comparator 20 outputs one comparison result (high potential) to the control terminal 14 through the second output terminal 23, allowing for the warning state to be maintained, and the switch element 10 to output the second reference signal through the first output terminal 13. When the signal level of the sensing signal is greater than the signal level of the second reference signal, the comparator 20 outputs another comparison result (low potential) to the control terminal 14 through the second output port 23, allowing for the warning state to be cleared and the switch element 10 to output the first reference signal through the first output terminal 13.

When the switch element 10 outputs the first reference signal to the comparator 20 through the first output terminal 13, the comparator 20 may also receive the sensing signal corresponding to the light signal from the fourth input terminal 22. When the signal level of the sensing signal is smaller than the signal level of the first reference signal, the comparator 20 outputs one comparison result (high potential) to the control terminal 14 through the second output terminal 23, allowing for the warning state to be notified and the switch element 10 to output the second reference signal through the first output terminal 13. On the other hand, when the signal level of the sensing signal is greater or equal to the signal level of the first reference signal, the comparator 20 outputs another comparison result (low potential) to the control terminal 14 through the second output terminal 23, allowing for the normal state to be maintained, and the switch element 10 to output the first reference signal through the first output terminal 13.

The disclosed circuit above can automatically switch the basis of determination. More specifically, when the control signal indicates the warning state, the circuit above may automatically switch the basis of determination to the level of the second reference signal. As such, if the light input increases until it is equal to or greater than the basis of determination, which is the level of the second reference signal at this point, the warning state is then cleared. When the control signal indicates the normal state, the circuit above may automatically switch the basis of determination to the level of the first reference signal. If the light decreases until it is smaller than the basis of determination, a corresponding warning may be generated.

By determining the signal intensity of the sensing signal in connection with the light input (which is corresponding to the optical power) to enable the optical line terminal apparatus to determine the receipt of the light signal, the fast signal response circuit 1 may not be affected by the internet speed and CDR, and may be applied to all kinds of optical line terminal apparatus of the passive optical network. Operating without determining the light input intensity simply through the microcontroller, the disclosed fast signal response circuit 1 has a faster response speed. Also, by switching between two determination bases, the signal sensing fast response circuit 1 may be capable of controlling the hysteresis.

Figure 2:
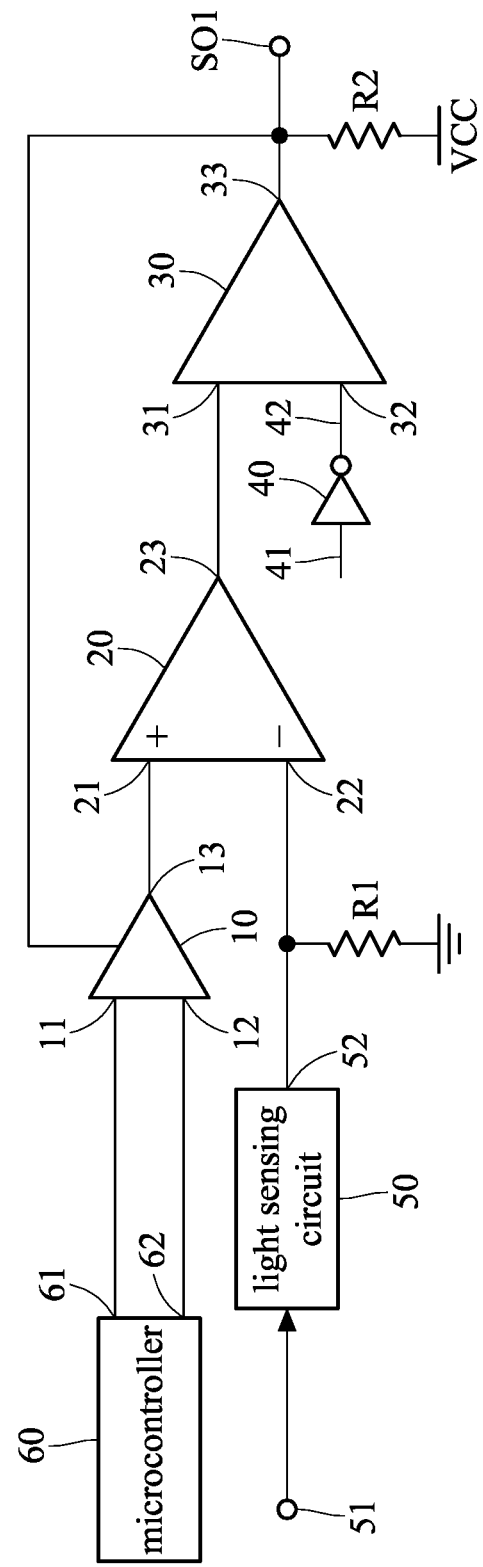
FIG. 2 shows a configuration diagram of a fast signal response circuit with hysteresis control according to an embodiment of the disclosure.

Please refer to FIG. 2 showing a configuration diagram of another fast signal response circuit with hysteresis control 1' according to another embodiment of the disclosure. As shown in FIG. 2, the fast signal response circuit 1' with hysteresis control includes the switch element 10 and the comparator 20, both of which might be implemented using the same switch element 10 and the comparator 20 in FIG. 1. In addition to the switch element 10 and the comparator 20, the fast signal response circuit 1' may further include an AND gate 30, a NOT gate 40, a light sensing circuit 50, a microcontroller 60, a sampling resistor R1, a pull-up resistor R2 and a signal output terminal SO1. It is worth noting that the AND gate 30, the NOT gate 40, the light sensing circuit 50, the microcontroller 60, the sampling resistor R1, the pull-up resistor R2, and the signal output terminal SO1 are optional elements according to the present disclosure.

The AND gate 30 includes the fifth input 31, the sixth input 32 and the third output 33. The fifth input 31 is electrically connected to the second output terminal 23, the sixth input terminal 32 receives a signal in connection with a reset signal. The third output terminal 33 is electrically connected to the control terminal 14 of the switch element 10 and electrically connected to the signal output terminal SO1. The NOT gate 40 includes a seventh input terminal 41 and a fourth output terminal 42. The seventh input terminal 41 is configured to receive the reset signal, the fourth output terminal 42 is electrically connected to the sixth input terminal 32. In other words, the control terminal 14 is electrically connected to the signal output terminal SO1 and the third output terminal 33, the fifth input terminal receives the comparison result, and the sixth input terminal 32 receives the reset signal calculated by the NOT gate 40.

In particular, the fifth input terminal 31 receives the comparison result, the NOT gate 40 reverses the phase of the reset signal, and inputs the reversed reset signal to the sixth input terminal 32, the AND gate 30 calculates the reversed reset signal and the comparison result and outputs the control signal through the third output terminal 33. And the control signal is transmitted to the switch element 10 and a foreign host (for example, a switch exchange) through the control terminal 14 and the signal output terminal SO1, respectively. The reset signal is from the foreign host, and is used to instruct the switching of the light input source. Further, the terminal apparatus is an optical line terminal apparatus and outputs the reset signal at the high potential to the NOT gate 40 when the input light source switches, and the NOT gate 40 outputs the reset signal at the low potential to be indicative of the light input.

The light sensing circuit 50 includes an eighth input terminal 51 and a fifth output terminal 52. The eighth terminal 51 is configured to receive the light input, the fifth output terminal 52 is electrically connected to the fourth output terminal 22, with a sampling resistor R1 disposed between the fifth output terminal 52 and the fourth input terminal 22. The light sensing circuit 50 generates a corresponding sensing signal according to the light input, and outputs the sensing signal to the fourth input terminal 22 through the fifth output terminal 52. It is worth noting that the sensing signal in terms of voltage could be a current times the sampling resistor R1 at the time the light sensing circuit 50 receives the light input.

In one implementation, the light sensing circuit 50 includes a photodiode and a trans-impedance amplifier, the photodiode receives the light input to generate a corresponding current, and the corresponding current is mirrored and outputted through the trans-impedance amplifier. In another implementation, the light sensing circuit 50 includes an avalanche photodiode and a current mirror, the avalanche photodiode receives the light input to generate the corresponding current, which is further received by the current mirror. And the current mirror might then generate a current of the same amount of the current provided by the avalanche photodiode or a fixed ratio of the same.

The microcontroller 60 includes a sixth output terminal 61 and a seventh output terminal 62, the sixth output terminal 61 is electrically connected to the first input terminal 11, and the seventh output terminal 62 is electrically connected to the second input terminal 12. The microcontroller 60 outputs the first reference signal and the second reference signal to the switch element 10 through the sixth output terminal 61 and the seventh output terminal 62, respectively, and the signal level of the second reference signal is greater than the signal level of the first reference signal, and the switch element 10 outputs the first reference signal or the second reference signal according to the control signal. The microcontroller 60 controls and outputs the first reference signal and the second reference signal through Inter-Integrated Circuit (I2C). For example, when the control signal is at its low potential, the switch element 10 outputs the first reference signal. On the other hand, when the control signal is at its high potential, the switch element 10 outputs the second reference signal. Through the reference signals with different levels provided by the microcontroller 60, signal detect hysteresis adjustment function is achieved, with the adjustment ranging between 0.5~21 db. As such, the disclosed circuit could accommodate different kinds of the light modules. The microcontroller 60 also may adjust/calibrate the reference signal, to provide more accurate responses.

One end of a pull-up resistor R2 is electrically connected to the third output terminal 33 and the control terminal 14, with the other end thereof electrically connected to a voltage supply line of a supply voltage VCC. With the above arrangement, the control signal could be at an initial non-zero level. Because the disposition of the pull-up resistor R2 and the voltage supply line, the initial signal level of the control signal could be set at the high potential, allowing for so the switch element 10 to operate normally.

As previously mentioned, when the eighth input terminal 51 receives the light input, the light sensing circuit 50 delivers its output as the sensing signal accordingly to the comparator 20 through the fifth output terminal 52. At the same time, the control signal is pulled up to the high potential level (by the pull-up resistor R2), which is indicative of the warning state, before being transmitted to the switch element 10 through the control terminal 14. The switch element 10 outputs the second reference signal to the comparator 20 through the first output terminal 13 when receiving the control signal of the high potential, and the comparator 20 compares the sensing signal and the second reference signal. When the signal level of the sensing signal is smaller than the signal level of the second reference signal, the comparison result the comparator 20 outputs is at its high potential level, causing the warning state to be maintained. When the signal level of the sensing signal is greater than or equal to the signal level of the second reference signal, the comparison result the comparator 20 outputs is at its low potential level, allowing for the warning state to be cleared.

At this time, the reset signal is at its low potential level and the signal which is at the high potential level of the reset signal is outputted to the AND gate 30 through the fourth output terminal 42, the AND gate 30 outputs the control signal on basis of its inputs. When the comparison result and the reversed reset signal are both at their high potential levels, the AND gate 30 outputs the control signal of its high potential level, which is further transmitted to the foreign host through the output terminal SO1 to indicate the warning state and to the switch element 10 through the control terminal 14. On the other hand, when the inputs received by the AND gate 30 are either at their low potential levels the AND gate 30 outputs the control signal of the low potential through the third output terminal 33 to the switch element 10 through the control terminal 14. If the reset signal switches from its low potential level to its high potential level, the reversed reset signal (or the signal having the low potential level of the reset signal) is outputted to the AND gate 30, which outputs the control signal of the low potential level.

When the control signal is at its low potential level, the switch element 10 outputs the first reference signal through the first terminal 13 and the light sensing circuit 50 generates the sensing signal according to the light input to the comparator 20 through the fifth output terminal 52. The comparator 20 compares the sensing signal and the first reference signal. When the signal level of the sensing signal is smaller than the signal level of the first reference signal, the comparison result the comparator 20 outputs is at its high potential level by which the warning state might be indicated. Otherwise, the comparison result the comparator 20 outputs is at its low potential level to indicate the normal state. At this time, the signal having the high potential level of the reset signal is outputted to the AND gate 30 through the fourth output terminal 42. When AND gate 30 receives both inputs at their high potential levels, the AND gate 30 outputs the control signal at its high potential level to the foreign host through the signal output terminal SO1 to indicate the warning state. When either input received by the AND gate 30 is at its low potential level, the AND gate 30 outputs the control signal having its low potential level to the switch element 10 through the control terminal 14.

A nanosecond high speed analog switch may be chosen as the switch element 10 with its response time about 50 ns, a nanosecond high speed comparator may be chosen as the comparator 20 with its response about 6 ns, and response time for the AND gate 30 and the NOT gate 40 is about 5 ns. The total response of the disclosed circuit 1' can be within 60 ns.

The circuit of the disclosure may realize the auto determination between the first reference signal and the second reference signal. When the control signal is at its high potential level (i.e., under no light or weak light circumstances), the circuit of the embodiment may automatically switch to output the second reference signal. On the other hand, however, if the sensing signal corresponding to the light input is greater than the second reference signal, the control signal turns from high potential to low potential, to clear the warning state. If the sensing signal corresponding to the light input is smaller than the second reference signal, the control signal remains at its high potential level. If the control signal is at its low potential level, the circuit of the embodiment may automatically switch to output the first reference signal, and with the control signal switching from the low potential level to the high potential level, the warning state may be presented is generated. But if the sensing signal corresponding to the light input is greater than the first reference signal, the control signal remains at its low potential level.

With the circuit configuration of this embodiment, the fast signal response circuit 1' and the fast signal response circuit 1 of the previous embodiment may share the same functionality.

In addition, by adjusting the signal levels of the first reference signal and the second reference signal through the microcontroller 60 the present disclosure could handle various specifications of terminal apparatus of passive optical network light modules. With the NOT gate 40, the disclosed circuit 1' may cope with the reset signal generated when the light input source is switched.

Figure 3:
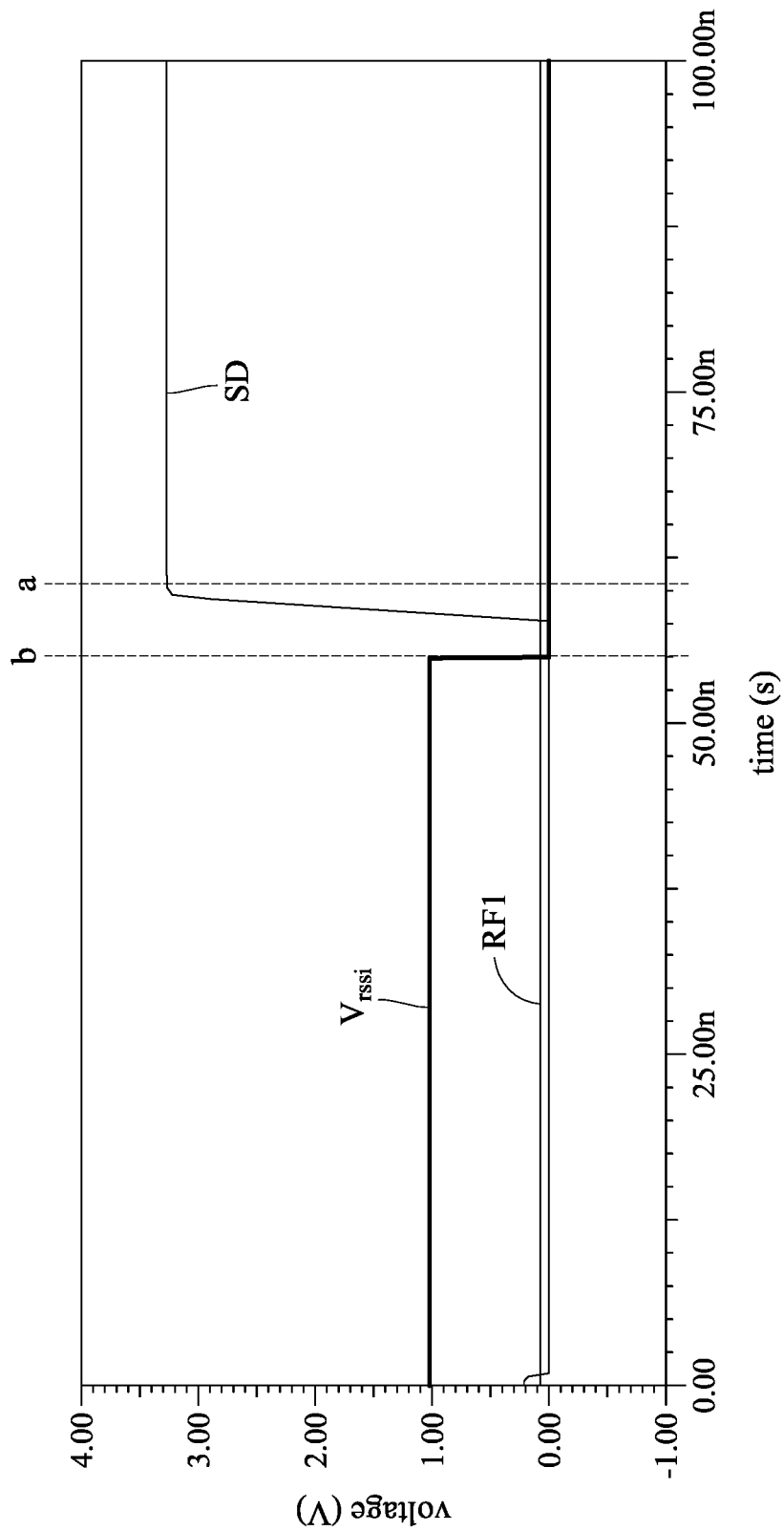
FIG. 3 is a signal simulation diagram when fast signal response circuit with hysteresis control operates using the first reference signal as the basis of determination.

Please refer to FIG. 3, it is a signal simulation diagram when the fast signal response circuit with hysteresis control operates using the first reference signal as the basis of determination. As shown in FIG. 3, when the first reference signal RF1 is set to −17.5 dBm, the responsivity of the light sensor RES is 1 A/W and the sampling resistor is 5.1 kΩ, the first reference signal RF1 could be acquired through the equation below:

$$10^{\frac{RF_1}{10}} \times Res \times R1$$

(Res is the responsivity of the light sensor, R1 is the sampling resistor), and the corresponding voltage of the first reference signal RF1 is 72.6 mV. Under the condition of the control signal SD having the low potential level, when the sensing signal $V_{rssi}$ is decreased from 1024 mV to 0 V, the control signal SD switches from the low potential level to the high potential level in the time period between b and a.

Figure 4:
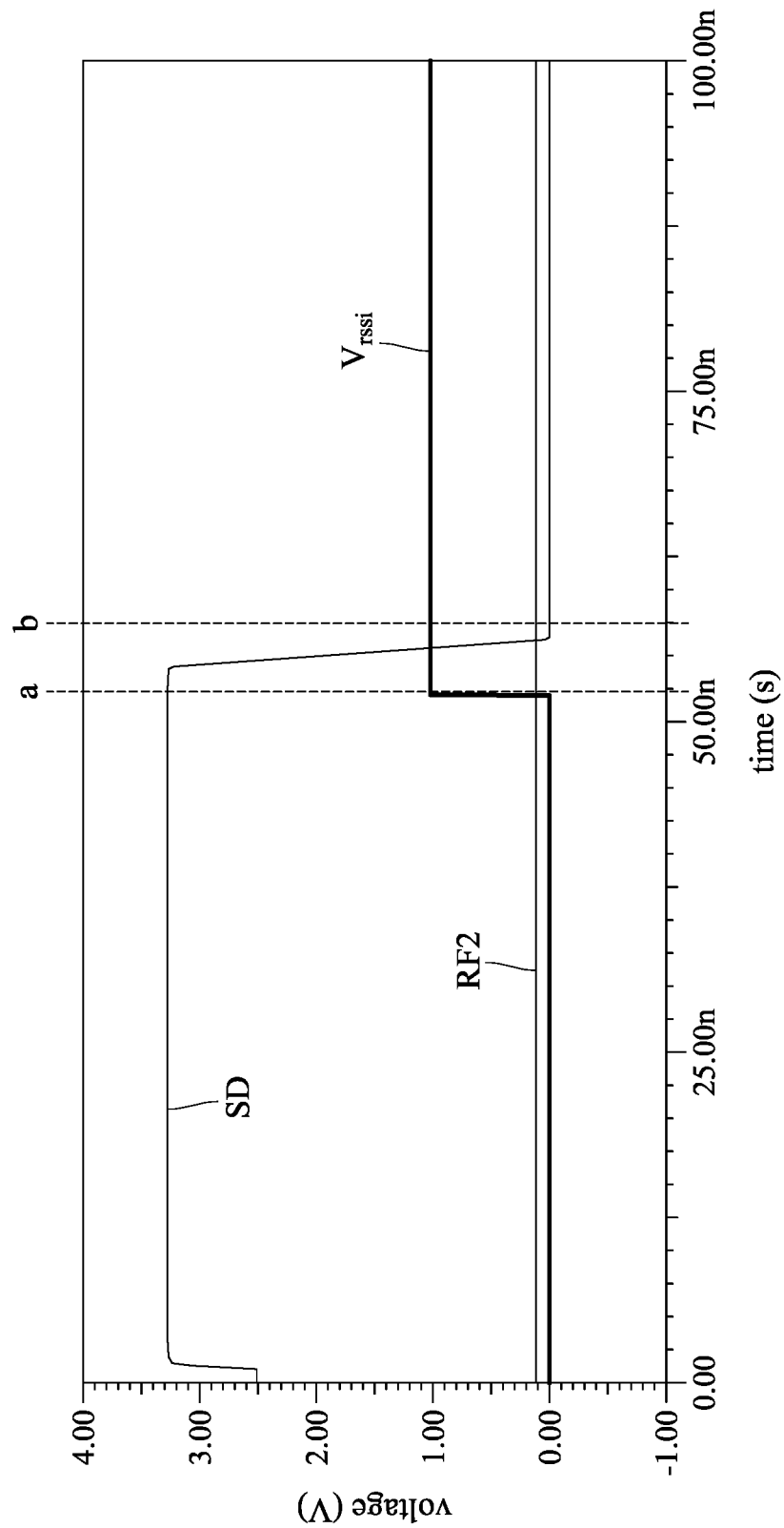
FIG. 4 is a signal simulation diagram when the fast signal response circuit with hysteresis control operates using the second reference signal as the basis of determination.

Please refer to FIG. 4, it is a signal simulation diagram when the fast signal response circuit with hysteresis control operates using the second reference signal as the basis of determination. As shown in FIG. 4, when the second reference signal RF2 is set to −15 dBm, the responsivity of the light sensor Res is 1 A/W and the sampling resistor R1 is 5.1 kΩ, the second reference signal RF2 could be acquired through the equation below:

$$10^{\frac{RF_1}{10}} \times Res \times R1$$

(Res is the responsivity of the light sensor, R1 is the sampling resistor), and the corresponding voltage of the second reference signal RF2 is 115 mV. Under the condition of the control signal SD having high potential, when the sensing signal Vrssi is increased from 0 mV to 1024 mV, the control signal SD switches from the high potential level to the low potential level in the time period between a and b.

What is claimed is:

1. A fast signal response circuit with hysteresis control, comprising:
  a switch element comprising a first input terminal, a second input terminal, a first output terminal and a control terminal, wherein the first input terminal is configured to receive a first reference signal, the second input terminal is configured to receive a second reference signal, the control terminal is configured to receive a control signal, the switch element is configured to output the first reference signal or the second reference signal through the first output terminal according to the control signal, and wherein the second reference signal has a higher signal level than a signal level of the first reference signal;
  a comparator comprising a third input terminal, a fourth input terminal and a second output terminal, wherein the third input terminal is connected to the first output terminal, the fourth input terminal is configured to receive a sensing signal corresponding to a light input, and the second output terminal from which a comparison result is outputted is connected to the control terminal; and
  a photo sensing circuit connected to the fourth input terminal and configured to generate the sensing signal according to the light input, wherein the photo sensing circuit comprises either a combination of a photodiode and a trans-impedance amplifier or a combination of an avalanche photodiode and a current mirror;
  wherein the sensing signal corresponding to the light input is generated by either a current generated by the photodiode and outputted through the trans-impedance amplifier or a current generated by the current mirror electrically connected to the avalanche photodiode.

2. The fast signal response circuit of claim 1, wherein when the control signal has a predetermined low potential, the switch element outputs the first reference signal through the first output terminal, and when the control signal has a predetermined high potential, the control signal indicates a warning state, and the switch element outputs the second reference signal through the first output terminal.

3. The fast signal response circuit with hysteresis control of claim 1, further comprising:
  an AND gate comprising a fifth input terminal, a sixth input terminal and a third output terminal, wherein the fifth input terminal is connected to the second output terminal, the sixth input terminal receives an input signal associated with a reset signal, and the third output terminal is connected to the control terminal of the switch element.

4. The fast signal response circuit with hysteresis control of claim 3, further comprising:
  a NOT gate comprising a seventh input terminal and a fourth output terminal, wherein the seventh input terminal is configured to receive the reset signal, and the fourth output terminal is electrically connected to the sixth input terminal.

5. The fast signal response circuit with hysteresis control of claim 3, wherein the reset signal is received from a terminal apparatus and is configured to indicate switching of a light input source.

6. The fast signal response circuit with hysteresis control of claim 3, further comprising a pull-up resistor, wherein one end of the pull-up resistor is connected to the third output terminal and the control terminal, the other end of the pull-up resistor is connected to a voltage supply line that is configured to output a supplied voltage.

7. The fast signal response circuit with hysteresis control of claim 1, further comprising a sampling resistor, wherein the sampling resistor is disposed between the photo sensing circuit and the fourth input terminal.

8. The fast signal response circuit with hysteresis control of claim 1, further comprising a microcontroller, wherein the microcontroller is connected to the first input terminal and the second input terminal to supply the first reference signal and the second reference signal.

9. A fast signal response circuit with hysteresis control, comprising:
  a switch element comprising a first input terminal, a second input terminal, a first output terminal and a control terminal, wherein the first input terminal is configured to receive a first reference signal, the second input terminal is configured to receive a second reference signal, the control terminal is configured to receive a control signal, the switch element is configured to output the first reference signal or the second reference signal through the first output terminal according to the control signal, and wherein the second reference signal has a higher signal level than a signal level of the first signal;

a comparator comprising a third input terminal, a fourth input terminal and a second output terminal, wherein the third input terminal is connected to the first output terminal, the fourth input terminal is configured to receive a sensing signal corresponding to a light input, and the second output terminal from which a comparison result is outputted is connected to the control terminal;

a photo sensing circuit connected to the fourth input terminal and configured to generate the sensing signal according to the light input; and a sampling resistor disposed between the photo sensing circuit and the fourth input terminal.

10. The fast signal response circuit of claim 9, wherein when the control signal has a predetermined low potential, the switch element outputs the first reference signal through the first output terminal, and when the control signal has a predetermined high potential, the control signal indicates a warning state, and the switch element outputs the second reference signal through the first output terminal.

11. The fast signal response circuit with hysteresis control of claim 9, further comprising:

an AND gate comprising a fifth input terminal, a sixth input terminal and a third output terminal, wherein the fifth input terminal is connected to the second output terminal, the sixth input terminal receives an input signal associated with a reset signal, and the third output terminal is connected to the control terminal of the switch element.

12. The fast signal response circuit with hysteresis control of claim 11, further comprising:

a NOT gate comprising a seventh input terminal and a fourth output terminal, wherein the seventh input terminal is configured to receive the reset signal, and the fourth output terminal is electrically connected to the sixth input terminal.

13. The fast signal response circuit with hysteresis control of claim 11, wherein the reset signal is received from a terminal apparatus and is configured to indicate switching of a light input source.

14. The fast signal response circuit with hysteresis control of claim 11, further comprising a pull-up resistor, wherein one end of the pull-up resistor is connected to the third output terminal and the control terminal, the other end of the pull-up resistor is connected to a voltage supply line that is configured to output a supplied voltage.

15. The fast signal response circuit with hysteresis control of claim 9, further comprising a microcontroller, wherein the microcontroller is connected to the first input terminal and the second input terminal to supply the first reference signal and the second reference signal.

* * * * *